(12) United States Patent
Hou (10) Patent No.: US 9,397,184 B2
(45) Date of Patent: Jul. 19, 2016

(54) SEMICONDUCTOR DEVICE HAVING METAL GATE AND MANUFACTURING METHOD THEREOF

(71) Applicant: UNITED MICROELECTRONICS CORP., Hsin-Chu (TW)

(72) Inventor: Yong Tian Hou, Singapore (SG)

(73) Assignee: UNITED MICROELECTRONICS CORP., Science-Based Industrial Park, Hsin-Chu (TW)

(*) Notice: Subject to any disclaimer, the term of this patent is extended or adjusted under 35 U.S.C. 154(b) by 0 days.

(21) Appl. No.: 14/838,371

(22) Filed: Aug. 28, 2015

(65) Prior Publication Data
US 2015/0372105 A1    Dec. 24, 2015

Related U.S. Application Data

(63) Continuation of application No. 13/943,721, filed on Jul. 16, 2013, now abandoned.

(51) Int. Cl.
| | |
|---|---|
| *H01L 29/49* | (2006.01) |
| *H01L 29/66* | (2006.01) |
| *H01L 29/78* | (2006.01) |
| *H01L 21/8238* | (2006.01) |
| *H01L 29/16* | (2006.01) |
| *H01L 29/20* | (2006.01) |
| *H01L 29/423* | (2006.01) |
| *H01L 29/51* | (2006.01) |

(52) U.S. Cl.
CPC ...... *H01L 29/495* (2013.01); *H01L 21/823807* (2013.01); *H01L 21/823828* (2013.01); *H01L 21/823857* (2013.01); *H01L 29/16* (2013.01); *H01L 29/20* (2013.01); *H01L 29/42364* (2013.01); *H01L 29/4966* (2013.01); *H01L 29/517* (2013.01); *H01L 29/6659* (2013.01); *H01L 29/66545* (2013.01); *H01L 29/66651* (2013.01); *H01L 29/7848* (2013.01); *H01L 29/66636* (2013.01)

(58) Field of Classification Search
CPC ............ H01L 29/1045; H01L 29/66659; H01L 29/78; H01L 21/28518; H01L 21/823842; H01L 29/36; H01L 29/66477; H01L 29/66651; H01L 29/105; H01L 29/7838; H01L 29/7835
USPC .......... 257/345, 369, 348, 410, 344; 438/301, 438/479, 187, 199, 678, 766
See application file for complete search history.

(56) References Cited

U.S. PATENT DOCUMENTS

| | | | |
|---|---|---|---|
| 6,246,093 B1* | 6/2001 | Henrickson | H01L 29/1045 257/345 |
| 8,748,270 B1* | 6/2014 | Shifren | H01L 29/66659 257/E21.443 |
| 2006/0008973 A1 | 1/2006 | Phua | |
| 2006/0063320 A1* | 3/2006 | Orlowski | H01L 21/823807 438/199 |
| 2008/0096336 A1* | 4/2008 | Lim | H01L 21/28097 438/187 |
| 2009/0065865 A1* | 3/2009 | Ju | H01L 21/26513 257/344 |
| 2010/0052063 A1* | 3/2010 | Masuoka | H01L 21/28061 257/369 |

(Continued)

*Primary Examiner* — Kenneth Parker
*Assistant Examiner* — Bo Fan
(74) *Attorney, Agent, or Firm* — Winston Hsu; Scott Margo (57) ABSTRACT

A semiconductor device having metal gate includes a substrate, a metal gate positioned on the substrate, a high-k gate dielectric layer, and an epitaxial channel layer positioned in between the high-k gate dielectric layer and the substrate. A length of the epitaxial channel layer is larger than a length of the metal gate, and a bottom of the epitaxial channel layer and the substrate are coplanar.

7 Claims, 5 Drawing Sheets

(56) References Cited

U.S. PATENT DOCUMENTS

| | | | |
|---|---|---|---|
| 2010/0081262 A1* | 4/2010 | Lim | H01L 21/823842 438/479 |
| 2012/0088345 A1* | 4/2012 | Chen | H01L 21/28518 438/301 |
| 2013/0049140 A1 | 2/2013 | Asenov | |
| 2013/0059435 A1 | 3/2013 | Yang | |
| 2013/0249021 A1* | 9/2013 | Asenov | H01L 29/517 257/410 |
| 2014/0027853 A1* | 1/2014 | Asenov | H01L 29/78 257/348 |
| 2014/0199837 A1* | 7/2014 | Hung | H01L 21/76816 438/675 |

\* cited by examiner

SEMICONDUCTOR DEVICE HAVING METAL GATE AND MANUFACTURING METHOD THEREOF

CROSS REFERENCE TO RELATED APPLICATIONS

This is a continuation application of U.S. patent application Ser. No. 13/943,721, filed on Jul. 16, 2013, and all benefits of such earlier application are hereby claimed for this new continuation application.

BACKGROUND OF THE INVENTION

1. Field of the Invention

The invention relates to a semiconductor device having metal gate and manufacturing method thereof, and more particularly, to a semiconductor device having metal gate and manufacturing method integrated with epitaxy technique.

2. Description of the Prior Art

With semiconductor processes entering the era of the deep submicron meter, it has been more and more important to increase the metal-oxide semiconductor (MOS) drive current. To improve device performance, epitaxy technique is developed to enhance carrier mobility of the channel region.

On the other hands, with the trend toward scaling down the size of the semiconductor device, work function metals are provided to replace the conventional polysilicon gate to be the control electrode that competent to the high dielectric constant (herein after abbreviated as high-K) gate dielectric layer. The metal gate methods in the-state-of-art are categorized into the gate first process and the gate last process. Among the two main processes, the gate last process is able to avoid processes of high thermal budget and to provide wider material choices for the high-K gate dielectric layer and the metal gate, and thus the gate last process gradually replaces the gate first process.

It is observed that processes with high thermal budget impacts not only the metal gate process, but also the quality of the epitaxial layers. In the view of the above, there exists a need for integrating the epitaxy technique and metal gate process without encountering the high thermal budget issue.

SUMMARY OF THE INVENTION

According to an aspect of the present invention, a semiconductor device having metal gate is provided. The semiconductor device having metal includes a substrate, a metal gate positioned on the substrate, a high-k gate dielectric layer, and an epitaxial channel layer positioned in between the high-k gate dielectric layer and the substrate. A length of the epitaxial channel layer is larger than a length of the metal gate, and a bottom of the epitaxial channel layer and the substrate are coplanar.

According to an aspect of the present invention, a manufacturing method of a semiconductor device having metal gate is provided. According to the manufacturing method, a substrate having at least a first semiconductor device formed thereon is provided, and the first semiconductor device includes a first dummy gate. Next, the first dummy gate is removing to form a first gate trench in the first semiconductor device, and the substrate is exposed in a bottom of the first gate trench. After forming the first gate trench, an epitaxial channel layer is formed in the first gate trench.

According to an aspect of the present invention, a semiconductor device having metal gate is provided. The semiconductor device includes a substrate, a metal gate positioned on the substrate, a high-k gate dielectric layer, and an epitaxial channel layer positioned in between the high-k gate dielectric layer and the substrate. A length of the epitaxial channel layer is equal to a length of the metal gate.

According to the semiconductor device having metal gate and the manufacturing method thereof provided by the present invention, the metal-last process is integrated with the epitaxy technique. Accordingly, the epitaxial channel layer is formed in the gate trench after performing steps having high thermal budget such as source/drain formation, and silicide process. And the metal gate is subsequently formed in the gate trench. Since the epitaxial channel layer and the metal gate are all formed after process requiring high temperature, qualities of the metal gate and the epitaxial channel layer are no longer impacted by those processes and thus performance of the transistor device is improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-6 are drawings illustrating a manufacturing method for a semiconductor device having metal gate provided by a first preferred embodiment of the present invention, wherein

FIGS. 7-10 are drawings illustrating a manufacturing method for a semiconductor device having metal gate provided by a second preferred embodiment of the present invention, wherein

DETAILED DESCRIPTION

Figure 1:
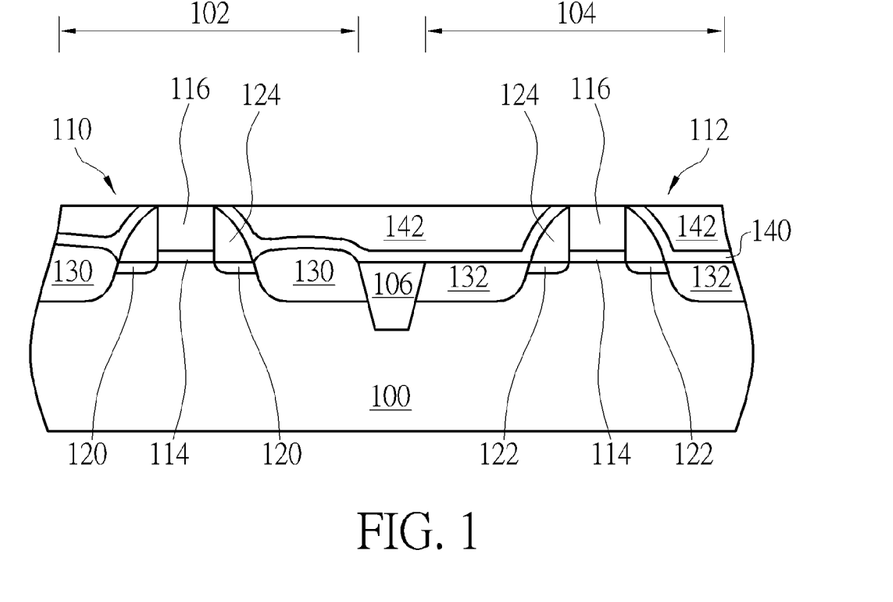

Please refer to FIGS. 1-6, which are drawings illustrating a manufacturing method for a semiconductor device having metal gate provided by a first preferred embodiment of the present invention. As shown in FIG. 1, the preferred embodiment first provides a substrate 100 such as silicon substrate, silicon-containing substrate, or silicon-on-insulator (SOI) substrate. The substrate 100 includes a core region 102 and a peripheral region 104 defined thereon. An isolation structure 106, such as a shallow trench isolation (STI) is formed in the substrate 100 between the core region 102 and the peripheral region 104 for rendering electrical isolation. A first semiconductor device 110 is formed in the core region 102 and a second semiconductor device 112 is formed in the peripheral region 104. In the preferred embodiment, the first semiconductor device 110 and the second semiconductor device 112 include the same conductivity type. However, those skilled in the art would easily realize that the first semiconductor device 110 and the second semiconductor device 112 can include conductivity types that are complementary to each other. Additionally, semiconductor devices having conductivity types complementary to the first semiconductor device 110 can be formed in the core region 102, but not detailed.

Please still refer to FIG. 1. The first semiconductor device 110 and the second semiconductor device 112 respectively includes an oxide layer 114, a dummy gate 116 such as a polysilicon layer formed on the oxide layer 114, and a patterned hard mask (not shown) formed on the dummy gate 116 for defining placement of the dummy gate 116. As shown in FIG. 1, the oxide layer 114 is formed between the dummy gate 116 and the substrate 100 for serving as an interfacial layer (IL). The intentionally grown interfacial layer is used in order to arrange a good interface between the surface of the substrate 100 and the gate insulator, particularly the high-k gate insulator, formed later. The oxide layer 114 is formed on the substrate 100 by high-temperature process such as in-situ silicon growth (ISSG), rapid thermal oxidation (RTO), etc. The first semiconductor device 110 and the second semiconductor device 112 further respectively include first lightly doped drains (hereinafter abbreviate as LDDs) 120 and second LDDs 122, a spacer 124, a first source/drain 130 and a second source/drain 132. Salicides (not shown) are respectively formed on the first source/drain 130 and the second source/drain 132. After forming the first semiconductor device 110 and the second semiconductor device 112, a contact etch stop layer (hereinafter abbreviated as CESL) 140 and an inter-layer dielectric (hereinafter abbreviated as ILD) layer 142 are sequentially formed. Since the steps and material choices for the abovementioned elements are well-known to those skilled in the art, those details are omitted herein in the interest of brevity.

Furthermore, selective strain scheme (SSS) can be used in the preferred embodiment. For example, a selective epitaxial growth (hereinafter abbreviated as SEG) method can be used to form at least the first source/drain 130. Accordingly, the first source/drain 130 of the first semiconductor device 100 in the core region 102 respectively includes a doped epitaxial layer. Because the lattice constant of the epitaxial layer is different from that of the silicon substrate, a strained stress is generated and a surface of the first source/drain 130 having the doped epitaxial layer may be higher than a surface of the substrate 100, as shown in FIG. 1.

Figure 2:
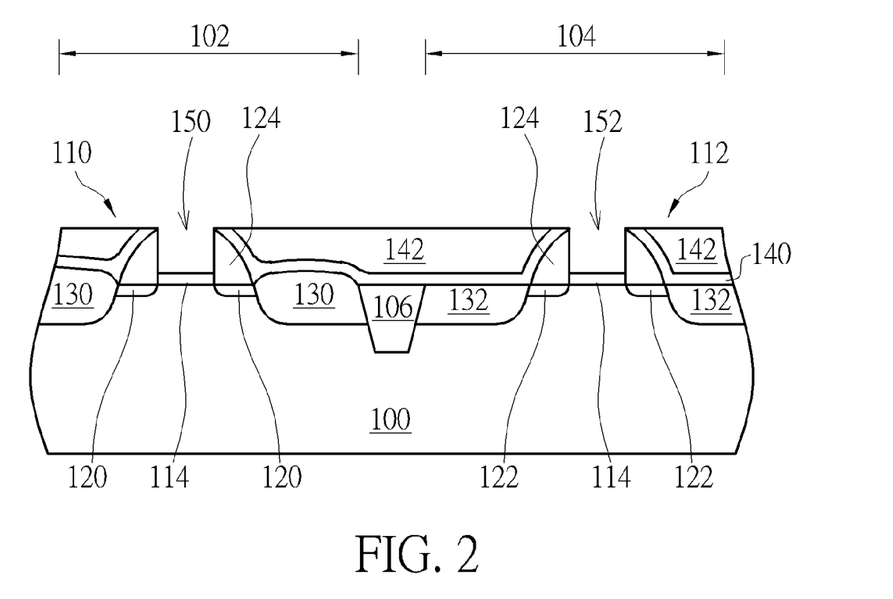
FIG. 2 is a schematic drawing in a step subsequent to FIG. 1.

Please refer to FIGS. 1 and 2. After forming the CESL 140 and the ILD layer 142, a planarization process is performed to remove a portion of the CESL 140 and a portion of the ILD layer 142 to expose the patterned hard masks or the dummy gates 116 of the first semiconductor device 110 and the second semiconductor device 112. Subsequently, a suitable etching process is performed to remove the patterned hard masks and the dummy gates 116 of the first semiconductor device 110 and the second semiconductor device 112. Consequently, a first gate trench 150 is formed in the first semiconductor device 110 and a second gate trench 152 is simultaneously formed in the second semiconductor device 112. As shown in FIG. 2, the oxide layers 114 are exposed in bottoms of both the first gate trench 150 and the second gate trench 152.

Figure 3:
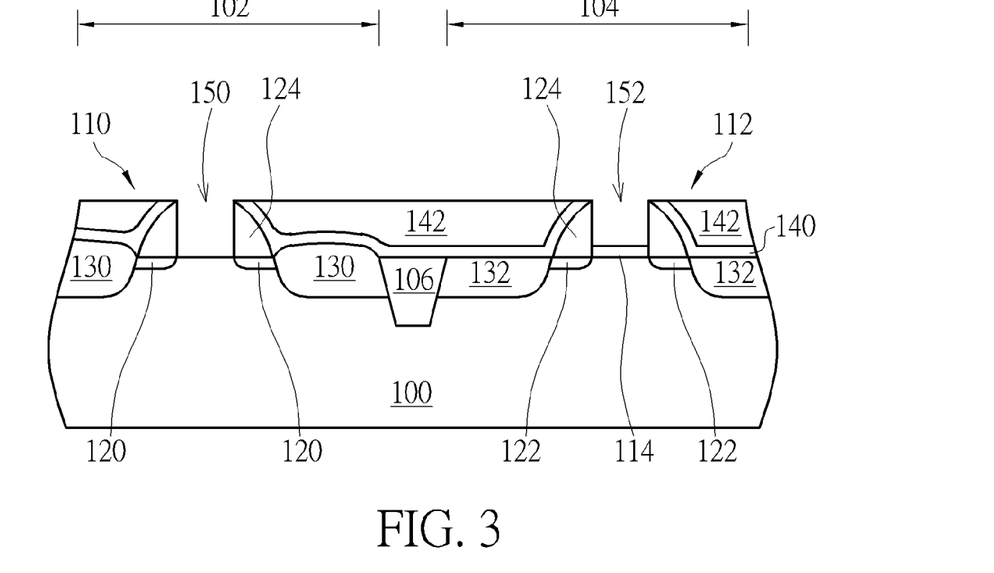
FIG. 3 is a schematic drawing in a step subsequent to FIG. 2.

Please refer to FIG. 3. More important, an etching process is performed to remove the oxide layer 114 from the first gate trench 150 with a suitable etchant after forming the first gate trench 150 and the second gate trench 152. It should be understood that a protection layer (not shown) can be formed in the second semiconductor device 112 in order to protect the oxide layer 114 exposed in the bottom of the second gate trench 152. Consequently, the substrate 100 is exposed in the bottom of the first gate trench 150 while the oxide layer 114 is exposed in the bottom of the second gate trench 152 according to the preferred embodiment. However, those skilled in the art would easily realize that the oxide layers 114 can be simultaneously removed from both of the first gate trench 150 and the second gate trench 152 according to a modification to the preferred embodiment, and thus the substrate 100 is exposed in the bottoms of both the first gate trench 150 and the second gate trench 152.

Figure 4:
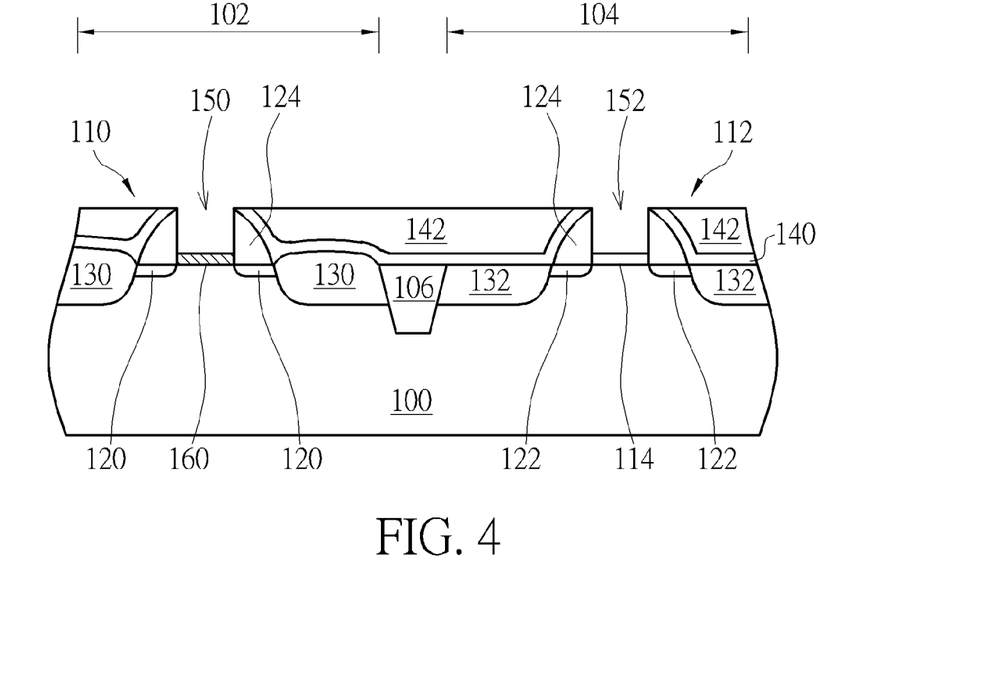
FIG. 4 is a schematic drawing in a step subsequent to FIG. 3.

Please refer to FIG. 4. After removing the oxide layer 114 from the first gate trench 150 to expose the substrate 100, a cleaning step is performed to remove native oxides or other impurities from the first gate trench 150. Next, an epitaxy process, such as a SEG method is performed to form an epitaxial channel layer 160 in the first gate trench 150. A thickness of the epitaxial channel layer 160 is between 2 nanometer (hereinafter abbreviated as nm) and 50 nm. Because the epitaxial materials only grow along the silicon surface, the epitaxial channel layer 160 is spontaneously formed on the exposed substrate 100 and confined within the first gate trench 150. Additionally, a bottom of the epitaxial channel layer 160 is coplanar with the surface of the substrate 100. It is noteworthy that the epitaxial channel layer 160 includes different materials depending on the conductivity type required in the preferred embodiment. For example, when the first semiconductor device 110 is a p-typed semiconductor device, the epitaxial channel layer 160 includes silicon (Si), germanium (Ge), or silicon germanium (SiGe). When the first semiconductor device 110 is an n-typed semiconductor device, the epitaxial channel layer 160 includes III-V material such as gallium arsenide (GaAs), indium phosphide (InP), indium arsenide (InAs), or indium antimonide (InSb). Additionally, the epitaxial channel layer 160 can include doped epitaxial material or undoped epitaxial material. When the epitaxial channel layer 160 includes the doped epitaxial material, it further includes dopants having conductivity type complementary to the first source/drain 130.

Figure 5:
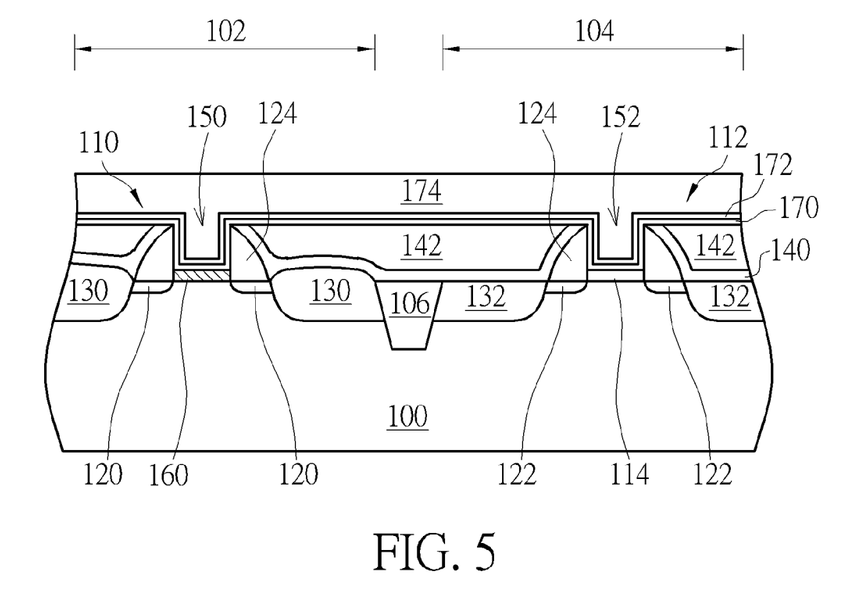
FIG. 5 is a schematic drawing in a step subsequent to FIG. 4.

Please refer to FIG. 5. After forming the epitaxial channel layer 160, a high-k gate dielectric layer 170 is formed on the substrate 100. It is therefore conceivable that the preferred embodiment adopts the high-k last process. The high-k gate dielectric layer 170 can include metal oxides such as rare earth metal oxides. The high-k gate dielectric layer 170 can include material selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), and barium strontium titanate ($Ba_xSr_{1-x}TiO_3$, BST).

Please still refer to FIG. 5. After forming the high-k gate dielectric layer 170, a work function metal layer 172 and a filling metal layer 174 are sequentially formed on the substrate 100. As shown in FIG. 5, the first gate trench 150 and the second gate trench 152 are filled up with the filling metal layer 174. The work function metal layer 172 includes different metal materials depending on the conductivity type required in accordance with the preferred embodiment. For example, when the first semiconductor device 110 is a p-typed semiconductor device, the work function metal layer 172 includes p-metal and possesses a work function between 4.8 and 5.2. When the first semiconductor device 110 is an n-typed semiconductor device, the work function metal layer 172 includes an n-metal and possesses a work function between 3.9 and 4.3. Furthermore, it is well-known to those skilled in the art that other layers such as the barrier layer, the etch stop layer, or, even the strained layer can be formed in the gate trenches 150/152 before forming the work function metal layer 172.

Figure 6:
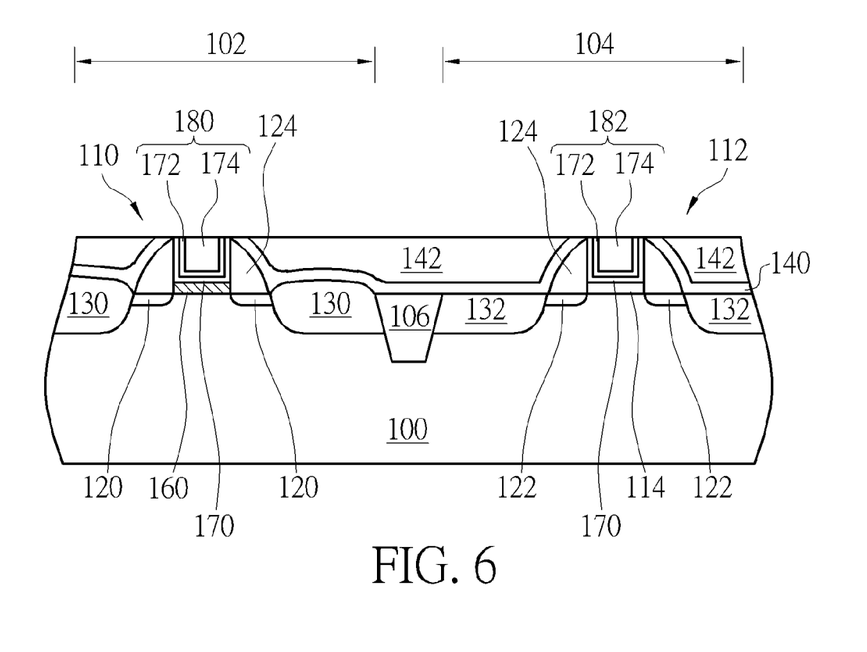
FIG. 6 is a schematic drawing in a step subsequent to FIG. 5.

Please refer to FIG. 6. Next, a planarization process, such as a chemical mechanical polishing (CMP) process is performed to remove the superfluous filling metal layer 174, work function metal layer 172, and the high-k gate dielectric layer 170. Consequently, a first metal gate 180 is formed in the first semiconductor device 110 and a second metal gate 182 is formed in the second semiconductor device 112. In addition, the ILD layer 140 and the CESL 142 can be selectively removed and sequentially reformed on the substrate 100 for improving performance of the semiconductor devices 110/112 in the preferred embodiment. As shown in FIG. 6, since the preferred embodiment adopts the high-k last process, the high-k gate dielectric layer 170 includes a U shape. More important, the epitaxial channel layer 160 is formed between the high-k gate dielectric layer 170 and the substrate 100, and confined within the spacer 124. A length of the epitaxial channel layer 160 is equal to a length of the first metal gate 180.

According to the semiconductor having metal gate and manufacturing method thereof provided by the first preferred embodiment, the gate-last process and epitaxy technique are integrated successfully. More important, the epitaxial channel layer 160 is formed in the first gate trench 150 after the processes having high thermal budget, such as the oxide layer 114 formation, the source/drain 130 formation, and the silicide process. And the metal gates 180/182 are subsequently formed. Since the epitaxial channel layer 160 and the metal gates 180/182 are all formed after the high temperature processes, qualities of the epitaxial channel layer 160 and the metal gates 180/182 are no longer impacted and thus the performance of the first semiconductor device 110 is improved.

Figure 7:
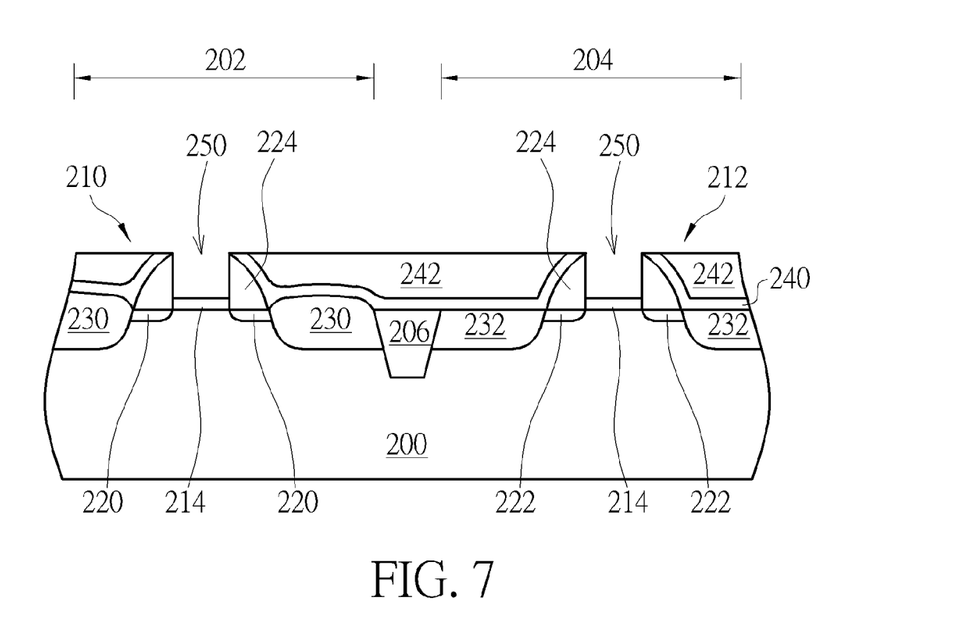

Please refer to FIGS. 7-10, which are drawings illustrating a manufacturing method for a semiconductor device having metal gate provided by a second preferred embodiment of the present invention. It should be noted that elements the same in both of the first and second preferred embodiments can include the same material and conductivity type, and therefore those details are omitted in the interest of brevity. As shown in FIG. 7, the preferred embodiment first provides a substrate 200. The substrate 200 includes a core region 202 and a peripheral region 204 defined thereon. An isolation structure 206, such as a shallow trench isolation is formed in the substrate 200 between the core region 202 and the peripheral region 204 for rendering electrical isolation. A first semiconductor device 210 is formed in the core region 202 and a second semiconductor device 212 is formed in the peripheral region 204. As mentioned above, the first semiconductor device 210 and the second semiconductor device 212 include the same conductivity type. However, those skilled in the art would easily realize that the first semiconductor device 210 and the second semiconductor device 212 can include conductivity types that are complementary to each other. Additionally, semiconductor devices having conductivity types complementary to the first semiconductor device 210 can be formed in the core region 202, but not detailed.

Please still refer to FIG. 7. The first semiconductor device 210 and the second semiconductor device 212 respectively includes an oxide layer 214, a dummy gate (not shown), and a patterned hard mask. As mentioned above, the oxide layer 214 is formed between the dummy gate and the substrate 200 for serving as an interfacial layer. The intentionally grown interfacial layer is used in order to arrange a good interface between the surface of the substrate 200 and the gate insulator, particularly the high-k gate insulator, formed later. As mentioned above, the oxide layer 214 is formed on the substrate 200 by high-temperature process such as ISSG, RTO, etc. The first semiconductor device 210 and the second semiconductor device 212 respectively include first LDDs 220 and second LDDs 222, a spacer 224, a first source/drain 230 and a second source/drain 232. Salicides (not shown) are respectively formed on the first source/drain 230 and the second source/drain 232. After forming the first semiconductor device 210 and the second semiconductor device 212, a CESL 240 and an ILD layer 242 are sequentially formed. Since the steps and material choices for the abovementioned elements are well-known to those skilled in the art, those details are omitted herein in the interest of brevity.

Furthermore, selective strain scheme (SSS) can be used in the preferred embodiment. For example, a SEG method can be used to form at least the first source/drain 230. Accordingly, the first source/drain 230 of the first semiconductor device 200 in the core region 202 respectively includes a doped epitaxial layer. Because the lattice constant of the epitaxial layer is different from that of the silicon substrate, a strain stress is generated and a surface of the first source/drain 230 having the doped epitaxial layer may be higher than a surface of the substrate 200, as shown in FIG. 7.

Please refer to FIG. 7. After forming the CESL 240 and the ILD layer 242, a planarization process is performed to remove a portion of the CESL 240 and a portion of the ILD layer 242 to expose the patterned hard masks or the dummy gates of the first semiconductor device 210 and the second semiconductor device 212. Subsequently, a suitable etching process is performed to remove the patterned hard masks and the dummy gates of the first semiconductor device 210 and the second semiconductor device 212. Consequently, a first gate trench 250 is formed in the first semiconductor device 210 and a second gate trench 252 is simultaneously formed in the second semiconductor device 212. As shown in FIG. 7, the oxide layers 214 are exposed in bottoms of both the first gate trench 250 and the second gate trench 252.

Figure 8:
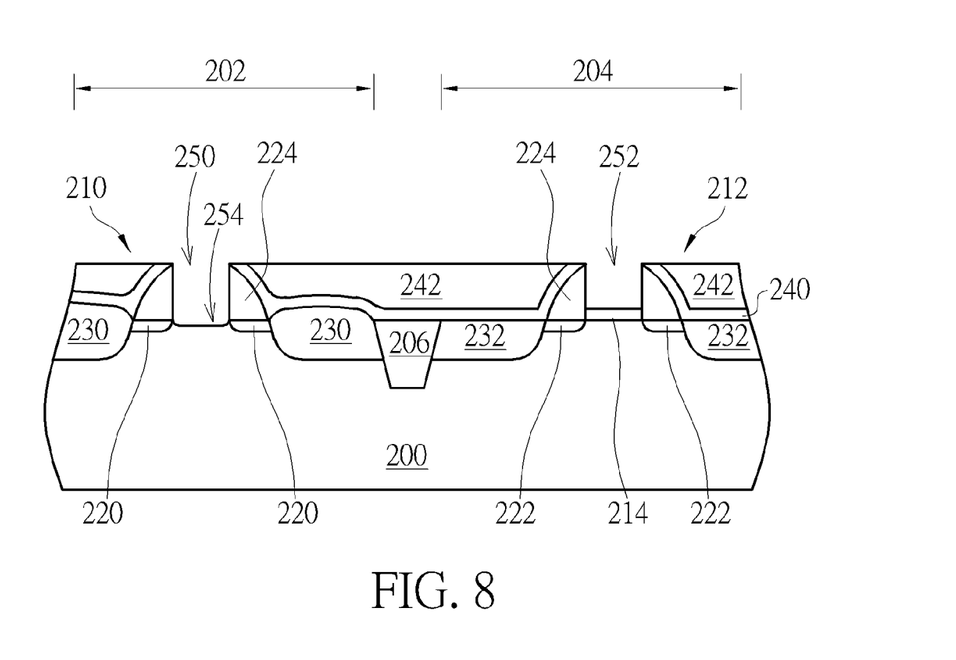
FIG. 8 is a schematic drawing in a step subsequent to FIG. 7.

Please refer to FIG. 8. Next, an etching process is performed to remove the oxide layer 214 from the first gate trench 250 with a suitable etchant. Consequently, the substrate 200 is exposed in the bottom of the first gate trench 250 after removing the oxide layer 240. More important, the etching process is performed to over etch the substrate 200 exposed in first gate trench 250, and thus a recess 254 is formed in the bottom of the first gate trench 250. It should be understood that a protection layer (not shown) can be formed in the second semiconductor device 212 in order to protect the oxide layer 214 exposed in the bottom of the second gate trench 252. Consequently, the substrate 200 is exposed in the bottom of the first gate trench 250, particularly exposed in a bottom of the recess 254, while the oxide layer 214 is exposed in the bottom of the second gate trench 252 according to the preferred embodiment. However, those skilled in the art would easily realize that the oxide layers 214 in both of the first gate trench 250 and the second gate trench 252 can be simultaneously removed according to a modification to the preferred embodiment, and thus the substrate 200 is exposed in the bottoms of both the first gate trench 250 and the second gate trench 252 and is over etched to form recesses respectively in the bottom of both the first gate trench 250 and the second gate trench 252.

Figure 9:
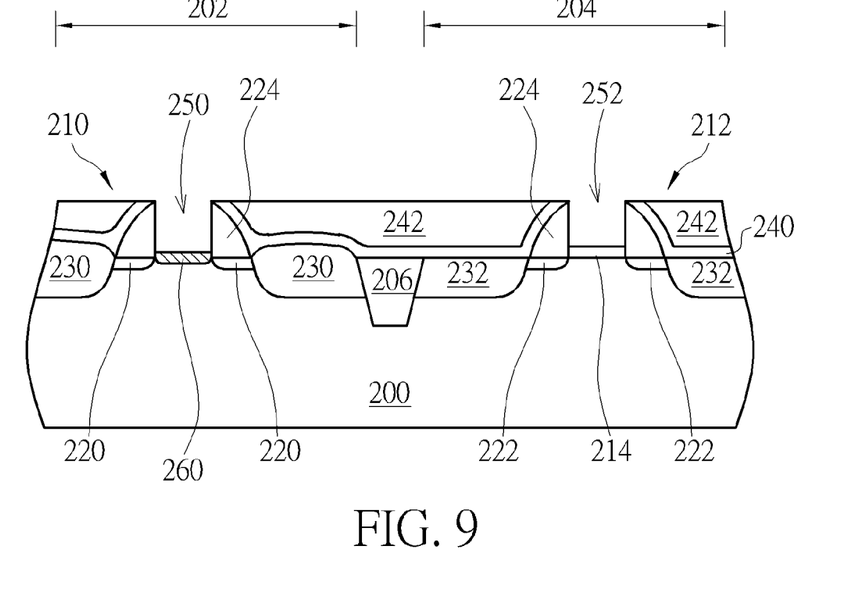
FIG. 9 is a schematic drawing in a step subsequent to FIG. 8.

Please refer to FIG. 9. After removing the oxide layer 214 and forming the recess 254, a cleaning step is performed to remove native oxides or other impurities from the recess 254. Next, an epitaxy process, such as a SEG method is performed to form an epitaxial channel layer 260 in the first gate trench 250. A thickness of the epitaxial channel layer 260 is between 2 nm and 50 nm. Because the epitaxial materials only grow along the silicon surface, the epitaxial channel layer 260 is spontaneously formed on the exposed substrate 200 and confined within the first gate trench 250. Additionally, a bottom of the epitaxial channel layer 260 is non-coplanar with the surface of the substrate 200. As shown in FIG. 9, the epitaxial channel layer 260 is confined within the spacer 224, and a bottom of the epitaxial channel layer 260 is lower than the surface of the substrate 200. As mentioned above, the epitaxial channel layer 260 includes different materials depending on the conductivity type required in the preferred embodiment. Since the materials have been disclosed in the first preferred embodiment, those details are omitted for simplicity. Additionally, the epitaxial channel layer 260 can include doped epitaxial material or undoped epitaxial material. When the epitaxial channel layer 260 includes the doped epitaxial material, it further includes dopants having conductivity type complementary to the first source/drain 230.

Figure 10:
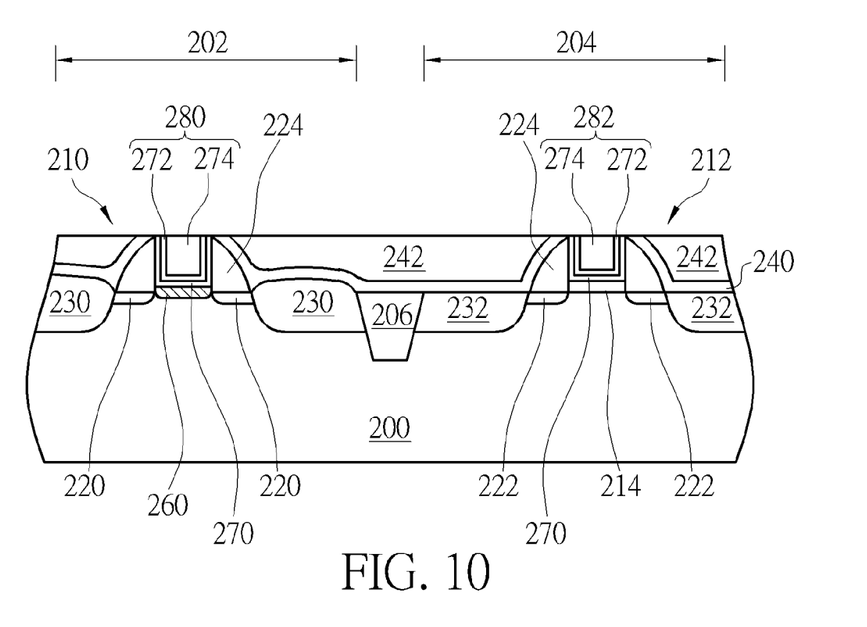
FIG. 10 is a schematic drawing in a step subsequent to FIG. 9.

Please refer to FIG. 10. After forming the epitaxial channel layer 260, a high-k gate dielectric layer 270 is formed on the substrate 200. The materials used to form the high-k gate dielectric layer 270 are the same with those detailed in the first preferred embodiment, therefore those materials are omitted for simplicity. It is therefore conceivable that the preferred embodiment adopts the high-k last process. After forming the high-k gate dielectric layer 270, a work function metal layer 272 and a filling metal layer 274 are sequentially formed on the substrate 200. As shown in FIG. 10, the first gate trench 250 and the second gate trench 252 are filled up with the filling metal layer 274. In the preferred embodiment, the work function metal layer 272 includes different metal materials depending on the conductivity type required in accordance with the preferred embodiment. For example, when the first semiconductor device 210 is a p-typed semiconductor device, the work function metal layer 272 includes p-metal and possesses a work function between 4.8 and 5.2. When the first semiconductor device 210 is an n-typed semiconductor device, the work function metal layer 272 includes an n-metal and possesses a work function between 3.9 and 4.3. Furthermore, it is well-known to those skilled in the art that other layers such as the barrier layer, the etch stop layer, or, even the strained layer can be formed in the gate trenches 250/252 before forming the work function metal layer 272.

Please still refer to FIG. 10. Next, a planarization process, such as a CMP process is performed to remove the superfluous filling metal layer 274, work function metal layer 272, and the high-k gate dielectric layer 270. Consequently, a first metal gate 280 is formed in the first semiconductor device 210 and a second metal gate 282 is formed in the second semiconductor device 212. In addition, the ILD layer 240 and the CESL 242 can be selectively removed and sequentially reformed on the substrate 200 for improving performance of the semiconductor devices 210/212 in the preferred embodiment. As shown in FIG. 10, since the preferred embodiment adopts the high-k last process, the high-k gate dielectric layer 270 includes a U shape. More important, the epitaxial channel layer 260 is formed between the high-k gate dielectric layer 270 and the substrate 200, and confined within the spacer 224. A length of the epitaxial channel layer 260 is equal to a length of the first metal gate 280.

According to the semiconductor having metal gate and manufacturing method thereof provided by the second preferred embodiment, the gate-last process and epitaxy technique are integrated successfully. More important, the epitaxial channel layer 260 is formed in the first gate trench 250 after the processes having high thermal budget, such as the oxide layer 214 formation, the source/drain 230 formation, and the silicide process. And the metal gates 280/282 are subsequently formed. Since the epitaxial channel layer 260 and the metal gates 280/282 are all formed after the high temperature processes, qualities of the epitaxial channel layer 260 and the metal gates 280/282 are no longer impacted and thus the performance of the first semiconductor device 210 is improved. Furthermore, since the bottom of the epitaxial channel layer 260 is lower than the surface of the substrate 200, the channel region obtains more effective strained stress from the first source/drain 230 having the doped epitaxial material, and thus the performance of the first semiconductor device 210 is further improved.

According to the semiconductor device having metal gate and the manufacturing method thereof provided by the present invention, the metal-last process is integrated with the epitaxy technique. Accordingly, the epitaxial channel layer with the bottom coplanar or non-coplanar with the substrate is formed in the gate trench after steps of high thermal budget such as source/drain formation, and silicide process. And the metal gate is subsequently formed in the gate trench. Since the epitaxial channel layer and the metal gate are all formed after the processes having high thermal budget, qualities of the metal gate and the epitaxial channel layer are no longer impacted by those processes. For example, high resistance and current leakage due to the high thermal issue are all avoided and thus performance of the transistor device is improved. Additionally, the semiconductor device and the manufacturing method thereof provided by the present invention can be integrated with multi-gate technique, such as the fin field transistor (FinFET) technique.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device having metal gate, comprising:
a substrate;
a metal gate positioned on the substrate;
a high-k gate dielectric layer;
a plurality of lightly doped drains (LDDs) disposed in the substrate, wherein a top surface of the LDDs is the same as a top surface of the substrate; and
an epitaxial channel layer positioned in between the high-k gate dielectric layer and the substrate, a length of the epitaxial channel layer being larger than a length of the metal gate, wherein a bottom surface of the epitaxial channel layer and the top surfaces of the substrate both inside the semiconductor device and outside the semiconductor device are coplanar, respectively.
2. The semiconductor device having metal gate according to claim 1, wherein the high-k gate dielectric layer comprises a U shape.
3. The semiconductor device having metal gate according to claim 1, wherein the metal gate comprises at least a work function metal layer and a filling metal layer.
4. The semiconductor device having metal gate according to claim 1, wherein the semiconductor device is a p-typed semiconductor device and the epitaxial channel layer comprises Si, Ge, or SiGe.
5. The semiconductor device having metal gate according to claim 1, wherein the semiconductor device is an n-typed semiconductor device and the epitaxial channel layer comprises III-V material.

6. The semiconductor device having metal gate according to claim 1, further comprising a source/drain formed in the substrate.

7. The semiconductor device having metal gate according to claim 6, wherein the source/drain comprises a doped epitaxial layer, respectively.

* * * * *